US006878042B2

(12) United States Patent
Oshino (10) Patent No.: US 6,878,042 B2
(45) Date of Patent: Apr. 12, 2005

(54) DEVICES AND METHODS FOR HOLDING AN OPTICAL ELEMENT WITH REDUCED STRESS IN AN OPTICAL COLUMN AND WHILE PERFORMING AN OUT-OF-COLUMN PROCEDURE ON THE ELEMENT

(75) Inventor: Tetsuya Oshino, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/369,437

(22) Filed: Feb. 18, 2003

(65) Prior Publication Data

US 2003/0162484 A1 Aug. 28, 2003

(30) Foreign Application Priority Data

Feb. 22, 2002 (JP) ........................................ 2002-046230

(51) Int. Cl.[7] .................................................. B24B 1/00
(52) U.S. Cl. ........................ 451/41; 451/365; 451/367; 350/633; 359/818
(58) Field of Search ........................... 451/41, 365, 367; 350/633, 632, 631; 359/818, 819

(56) References Cited

U.S. PATENT DOCUMENTS

| 4,726,671 | A | | 2/1988 | Ahmad et al. | |
|---|---|---|---|---|---|
| 4,733,945 | A | | 3/1988 | Bacich | |
| 5,063,586 | A | | 11/1991 | Jewell et al. | |
| 5,249,082 | A | | 9/1993 | Newman | |
| 5,315,629 | A | | 5/1994 | Jewell et al. | |
| 5,815,310 | A | | 9/1998 | Williamson | |
| 5,986,827 | A | | 11/1999 | Hale | |
| 6,002,535 | A | * | 12/1999 | Jaulain et al. | ............... 359/830 |
| 6,400,516 | B1 | * | 6/2002 | Spinali | ........................ 359/819 |
| 6,402,329 | B1 | | 6/2002 | Bailly et al. | |
| 6,441,976 | B1 | * | 8/2002 | Okorocha | .................... 359/820 |

OTHER PUBLICATIONS

Born et al., "Electromagnetic Theory of Propagation, Interference and Diffraction of Light," *Principles of Optics*, Fourth Edition, pp. 468–473, 1970.
Montcalm et al., "Emerging Lithographic Technologies II: Multilayer reflective coatings for extreme–ultraviolet lithography," *Proceedings of SPIE*, 3331: pp. 42–51, 1998.
Tichenor et al., "Electron–Beam, X–Ray, EUV, and Ion–Beam Submicrometer Lithographies for Manufacturing V," *Proceedings of SPIE*, 2437: pp. 292–307, 1995.
Yamamoto, Masaki, "Sub–nm Figure Error Correction of An EUV Multilayer Mirror By Its Surface Milling," 7th*International Conference on Synchrotron Radiation Instrumentation, Book of Abstracts*, One Page, 2000.

* cited by examiner

*Primary Examiner*—Lee D. Wilson
*Assistant Examiner*—Alvin J Grant
(74) *Attorney, Agent, or Firm*—Klarquist Sparkman, LLP (57) ABSTRACT

Methods and devices are disclosed for holding an optical element in an optical column with reduced stress (e.g., thermal stress) to the optical element. The devices and methods are especially useful for holding reflective optical elements in an optical column of an optical system used for extreme ultraviolet lithography. The devices allow the elements to be mounted and detached readily from the column. In an embodiment, the device includes multiple anchoring members that attach to respective locations on the optical element. The anchoring members are, in turn, mounted in a mounting frame by a releasable attachment mechanism. Each anchoring member has at least a compliant region configured to prevent transmission of stress to and from the optical element.

20 Claims, 3 Drawing Sheets

DEVICES AND METHODS FOR HOLDING AN OPTICAL ELEMENT WITH REDUCED STRESS IN AN OPTICAL COLUMN AND WHILE PERFORMING AN OUT-OF-COLUMN PROCEDURE ON THE ELEMENT

FIELD

This disclosure pertains to individual optical elements (refractive or reflective) and to methods and devices for holding an optical element during use of the optical element, during polishing of the optical element, and during coating of the optical element (e.g., with a multilayer coating or antireflective coating). More specifically, the disclosure pertains to methods and devices for holding an optical element without distorting the element. The subject methods and devices have especial utility in optical systems as used in microlithography systems.

BACKGROUND

As the sizes of active circuit elements in microelectronic devices have continued to decrease, with corresponding increases in the density of circuits in these devices (such as integrated circuits), the pattern-resolution limitations of "optical" microlithography have become burdensome. In other words, optical microlithography is limited by the diffraction limitations of light. To achieve finer resolution of projected patterns, various "next generation lithography" (NGL) technologies currently are under active development. A key approach in this regard is microlithography performed using so-called "soft X-rays" having substantially shorter wavelengths (in the range of approximately 11 to 14 nm) than the deep ultraviolet wavelengths (in the range of approximately 150 to 200 nm) currently used in optical microlithography. Because of its use of substantially shorter wavelengths than used in optical microlithography, soft X-ray (SXR) microlithography offers prospects of substantially better resolution than obtainable using optical microlithography. Tichenor, et al., *Proceedings SPIE* 2437:292, 1995. SXR microlithography also is termed "extreme ultraviolet" (EUV) microlithography, and has been shown to resolve pattern elements having widths of 70 nm and smaller.

At EUV wavelengths, the refractive index of known materials is extremely close to unity (1; one). Consequently, it currently is impossible to fabricate refracting lenses for use with EUV wavelengths. Instead, EUV optical systems must utilize reflective optical elements. The reflective optical elements are generally of two types; glancing-incidence mirrors and multilayer-coated mirrors. Glancing-incidence mirrors achieve total reflection but at very high (glancing) angles of incidence. Multilayer-coated mirrors achieve high reflectivity of incident EUV at small angles of incidence (including normal incidence) by means of multiple surficial layer pairs of alternatingly laminated layers of different respective materials. For example, for use at EUV wavelengths of approximately 13.4 nm, Mo/Si multilayer-coated mirrors are used, in which the multilayer coating is formed of many layers of molybdenum (Mo) and silicon (Si) alternatingly laminated on the polished surface of a mirror substrate. Mo/Si multilayer-coated mirrors can achieve a reflectivity of 67.5% of normally incident EUV light. Mo/Be multilayer-coated mirrors, comprising alternating layers of Mo and Be, have a reflectivity of 70.2% of normally incident EUV light. Montcalm, *Proceedings SPIE* 3331:42, 1998.

A conventional EUV lithography (EUVL) system primarily comprises an EUV source, an illumination-optical system, a reticle stage, a projection/imaging-optical system (simply termed a projection-optical system), and a substrate stage. The EUV source is a laser-plasma source, a discharge-plasma source, or a synchrotron (undulator). The illumination-optical system comprises a glancing-incidence mirror that obliquely reflects EUV radiation incident to the mirror at a high angle of incidence. The illumination-optical system also includes a multilayer-coated mirror and a filter that transmits only EUV radiation of a specified wavelength. As noted above, since there are no known materials that are transparent to EUV light, the pattern-defining reticle is a reflective reticle, rather than a transmissive reticle used in optical microlithography.

The projection-optical system receives EUV light reflected from the reticle (and carrying an aerial image of the pattern illuminated by the illumination-optical system). The projection-optical system normally comprises multiple multilayer-coated mirrors that direct the "patterned beam" from the reticle to a resist-coated lithographic substrate (e.g., resist-coated semiconductor wafer). The resist coating renders the substrate "sensitive" to exposure by the patterned beam. As the patterned beam is focused by the projection-optical system onto the surface of the sensitive substrate, the pattern is imprinted (and thus "transferred") to the resist. Since EUV radiation is absorbed and attenuated by the atmosphere, the entire optical path from the EUV source to the substrate is maintained under high vacuum (e.g., $1 \times 10^{-5}$ Torr or less).

As noted above, the projection-optical system comprises multiple multilayer-coated mirrors. Since the reflectivity of a multilayer-coated mirror is not 100%, it is desirable that the number of such mirrors in the projection-optical system be as low as possible to minimize loss of EUV light. For example, projection-optical systems comprising four multilayer-coated mirrors (e.g., Jewell et al., U.S. Pat. No. 5,315,629; Jewell, U.S. Pat. No. 5,063,586) and six multilayer-coated mirrors (e.g., Williamson, U.S. Pat. No. 5,815,310) are known.

Unlike a refractive optical system through which a light flux usually travels in one direction, reflective optical systems usually require that the light flux propagate back and forth in the system. Hence, with a reflective optical system, it is difficult to have a large numerical aperture (NA) due to restrictions imposed by making sure that the mirrors do not eclipse the light flux. Current four-mirror optical systems have a NA of no more than about 0.15. Current six-mirror systems have a somewhat larger NA. Any of these systems typically has an even number of mirrors so that the reticle stage and substrate stage can be disposed on opposite ends of the projection-optical system.

In these reflective optical systems, aberrations must be corrected using a limited number of reflective surfaces. Consequently, one or more of the multilayer-coated mirrors has an aspherical reflective surface. Also, these optical systems typically have a ring-shaped optical field to facilitate correction of aberrations only at a specified range of image-height, but which prevents the entire pattern from being exposed in a single "shot." Hence, to transfer an entire pattern from the reticle to the substrate, exposure is performed while scanning the reticle stage and substrate stage at respective velocities that differ from each other by the "reduction" (demagnification) factor of the projection-optical system.

The types of projection-optical systems described above for use in EUV microlithography systems are so-called "diffraction-limited" optical systems, in which designspecified performance cannot be achieved unless wavefront aberrations are kept sufficiently small. A standard wavefront error (WFE) of $\lambda/14$ or less (using Marechal's root mean square (RMS)) of the exposure wavelength ($\lambda$) is a generally accepted tolerance for wavefront-aberration in a diffraction-limited optical system (see Born and Wolf, *Principles of Optics*, 4th edition, Pergamon Press 1970, p. 469). Under this condition the Strehl intensity (ratio of the maximum intensity of the point-spread functions in an optical system that has aberrations to the same parameter in an aberration-free optical system) is 80% or greater. The projection-optical system in an actual EUVL system usually is manufactured to exhibit an even lower wavefront error.

Wavelengths primarily in the range of 11 to 13 nm are used as the exposure wavelength in current EUVL systems that are the subject of intensive research and development effort. The acceptable form error (FE) for individual mirrors for a given wavefront error in an optical system is given by the following equation:

$$FE = WFE/2/m^{1/2}(RMS) \qquad (1)$$

wherein "m" is the number of mirrors constituting the optical system. The divisor of 2 accounts for the fact that both incident light and reflected light are affected by the form error in a reflective optical system. Hence, the allowable form error for each individual mirror in a diffraction-limited optical system is expressed by the following equation for wavelength $\lambda$ and mirror count m:

$$FE = \lambda/28/m^{1/2}(RMS) \qquad (2)$$

For example, at $\lambda=13$ nm, FE=0.23 nm RMS in a four-mirror optical system, and FE=0.19 nm RMS in a six-mirror optical system. In view of these specifications, each mirror must be polished and coated with extremely high accuracy and precision.

Under current circumstances, even if the surface of an optical element were precision-finished to within tolerances, a problem can arise during mounting of the element in an optical "column" or other structure that holds the elements relative to each other in the optical system. More specifically, whenever an optical element is being held by a holding device, the holding members of the device press against the optical element. The resulting stress in the optical element causes distortion of the surface of the optical element.

In addition, as noted above, multilayer-coated mirrors are not 100% reflective to incident EUV radiation. The non-reflected radiation typically is absorbed by the mirror and converted into heat. Consequently, multilayer-film mirrors are susceptible to thermal fluctuations (notably thermal expansion) during use. As a mirror being held by a conventional holding device undergoes thermal expansion, the force locally applied to the mirror by the holding members of the device changes due to the different coefficients of thermal expansion of the mirror and holding device. The resulting stress on the mirror causes deformation of the mirror. A deformed mirror in the projection-optical system of an EUVL system causes the entire optical system to exhibit increased aberrations, which decreases the accuracy and precision of microlithography being performed using the system.

Recently, a groundbreaking advance was reported in which a sub-nanometer form error on a multilayer mirror was corrected by polishing or etching away, at the location of the form error, one layer at a time from the surface of the multilayer-coating. Yamamoto, 7 *th International Confer-ence on Synchrotron Radiation Instrumentation*, Berlin, Germany, Aug. 21–25, 2000, POS2–189). Correcting the surface profile of a multilayer-coated mirror by removing part of the multilayer-coating requires use of equipment capable of controlling the amount of multilayer-coating actually removed to extremely high accuracy and precision. In actual practice, it currently is difficult to control, in a precise manner, the amount of multilayer-coating removed, regardless of whether material is removed by wet-etching, polishing, or application of a directed stream of metal or ceramic powder (including "sandblasting").

The Yamamoto technique is a "global" technique applied to the entire surface of the multilayer coating. A related technique involves "local" removal of one or more layers from a region (zone) of the surface. When correcting wavefront error using a local technique, it is necessary that the edges of zones in which one or more layers have been removed not be abrupt, but rather have a gradation with respect to amount of material actually removed. This is because corrections to the phase of reflected light vary with the amount of multilayer-coating actually removed, and because the degree of phase-correction varies within the surface of the multilayer-coated mirror. Since the amount of surficial processing applied for making these types of corrections is on the order of a few nanometers to several tens of nanometers, the distribution of area over which processing is performed also must be controlled with extremely high accuracy and precision.

Conventionally, during polishing, an optical element is rigidly held using an adhesive. Unfortunately, adhesives tend to soften and/or dissolve when contacted by a polishing fluid, which results in an inaccuracy with which the optical element is being held during polishing. An optical element being held inaccurately or held with inadequate stability during polishing tends to result in poor polishing results. An optical element also conventionally is held rigidly by an adhesive during formation of a multilayer coating on the surface of the optical element, and multilayer-coating procedures typically are performed inside a vacuum chamber at high vacuum. Since adhesives tend to outgas under high vacuum, attainment of the requisite high vacuum can be difficult. In addition, conventional multilayer-coating processes typically are preceded by solvent-washing of the optical element. Contact of the adhesive by the solvent can dissolve some of the solvent and form a solvent deposit on the surface of the optical element. Such a deposit can prevent the multilayer coating from adhering properly to the surface.

SUMMARY

In view of the shortcomings of the prior art, as summarized above, the present invention provides, inter alia, devices and methods for holding an optical element in a manner representing a substantial improvement over conventional methods. The subject device is capable of holding an optical element so that the element can be held and released easily without causing a significant change in stress (manifest as, e.g., distortion) of the optical element. The device allows the optical element to be installed in an EUV lithography (EUVL) system. The device also effectively holds the optical element, without distortion or other stress-related effects, during a polishing procedure or during a surficial coating procedure. Since the optical element is not subjected to a significant stress change while being held, the procedures can be performed within a specified distribution and with high accuracy and precision.

According to a first aspect of the invention, devices are provided for holding an optical element. An embodiment of such a device comprises a holding frame and multiple anchoring members attached to respective locations on the optical element. The device also includes releasable attachment mechanisms that attach the anchoring members to the holding frame. Each anchoring member has a respective compliant portion configured to allow the anchoring member to hold the optical element without the optical element experiencing a significant change in stress being transmitted to or from the optical element through the anchoring members.

Typically, but not necessarily, the optical element has an edge surface and multiple mounting ears extending therefrom. To hold such an optical element, each anchoring member receives and holds a respective mounting ear (e.g., in a clamping manner). The anchoring members can extend radially and/or equi-angularly from the holding frame to the optical element.

Each anchoring member can be configured to clamp a respective mounting ear in at least one clamping direction. For example, the anchoring members can be configured to clamp the respective mounting ears in respective radial directions to the optical element. Alternatively, the anchoring members can be configured to clamp the respective mounting ears in a direction parallel to the optical axis of the optical element. Further alternatively, the anchoring members can be configured to clamp the respective mounting ears in two clamping directions. Each anchoring member can define a receptacle for a respective mounting ear, wherein at least one screw or bolt is used to secure the receptacle to the mounting ear. In another embodiment each anchoring member comprises a respective compliant portion that holds the anchoring member to a respective mounting ear. For example, each anchoring member can have a respective rigid portion and a respective compliant portion attachable to the rigid portion. With such a configuration, whenever the anchoring member is attached to the optical element, the compliant portion is compliantly loaded (e.g., spring-loaded) with respect to the respective location on the element and to the rigid portion. The anchoring members can be made of any suitable material such as a metal or a ceramic.

According to another aspect of the invention, methods are provided for holding an optical element during use of the optical element (e.g., in an optical column) or while executing a procedure on the optical element. An embodiment of such a method comprises attaching multiple anchoring members to respective locations on the optical element. Each anchoring member has a respective compliant portion configured to prevent, while the anchoring member is attached to the optical element, transmission of stress to and from the optical element through the anchoring member. The anchoring members are releasably attached to a holding frame so as to hold each anchoring member at a fixed position relative to the optical element.

If the optical element has mounting ears or the like extending therefrom at respective locations, the anchoring members can be attached to the respective mounting ears in a manner by which each anchoring member receives and holds the respective mounting ear. For example, the anchoring members can be attached to the mounting ears by clamping in at least one clamping direction. If the optical element has multiple mounting ears extending therefrom, the anchoring members can be attached to the respective mounting ears in a manner by which each anchoring member receives and holds the respective mounting ear. For example, the anchoring members can be clamped to their respective mounting ears. The anchoring members can extend in a radial direction (e.g., equi-angularly) from the holding frame to the optical element. In another example, the anchoring members can be attached to their respective locations in a direction parallel to the optical axis of the optical element.

The compliance of the anchoring members can be manifest in any of various ways. For example, at least a portion of the anchoring member can be made of a compliant material or be configured to exhibit compliant behavior relative to another portion of the anchoring member. In another example pertaining to attachment of anchoring members to respective mounting ears, each anchoring member can be clamped to the respective mounting ear by at least one screw tightened against the mounting car, wherein the screw(s) provide the compliance.

According to another aspect of the invention, optical systems are provided that comprise an optical column, an optical element, and a holding device (such as any of the holding devices summarized above) that holds the optical element in the optical column. The optical system can be a reflective optical system, in which event the optical element is a reflective optical element such as a multilayer-coated mirror as used in an EUV optical system.

According to yet another aspect of the invention, methods are provided for holding an optical element while the optical element is being subjected to an out-of-column procedure such as a polishing procedure. An embodiment of such a method comprises attaching a respective anchoring member to each of multiple attachment locations on the optical element. Each anchoring member has a respective compliant portion configured to prevent, while the anchoring member is attached to the optical element, significant transmission of stress to and from the optical element through the anchoring member. The method also comprises the step of releasably attaching each anchoring member to a holding frame that holds the anchoring members at respective fixed positions relative to the optical element, thereby holding the optical element in a polishing position.

According to yet another aspect of the invention, methods are provided for polishing an optical element. An embodiment of such a method comprises attaching respective anchoring members (configured as summarized above) to each of multiple attachment locations on the optical element. Each anchoring member is releasably attached to a holding frame that holds the anchoring members at a fixed positions relative to the optical element, thereby holding the optical element in a polishing position. After so mounting the optical element, the element is polished.

According to yet another aspect of the invention, methods are provided for holding an optical element while the optical element is being subjected to an out-of-column procedure such as a coating procedure. An embodiment of such a method comprises attaching a respective anchoring members (configured as summarized above) to each of multiple attachment locations on the optical element. Each anchoring member is releasably attached to a holding frame that holds the anchoring members at respective fixed positions relative to the optical element, thereby holding the optical element in a coating-application position.

According to yet another aspect of the invention, methods are provided for coating a surface of an optical element. An embodiment of such a method comprises attaching respective anchoring members (configured as summarized above) to each of multiple attachment locations on the optical element. Each anchoring member is releasably attached to a holding frame that holds the anchoring members at fixed positions relative to the optical element, thereby holding the optical element in a position suitable for coating. After so mounting the optical element, the element is coated. The coating can be, e.g., a multilayer-film coating.

Whenever an optical element is held in a manner as summarized above, the optical element does not press against the holding frame (or vice versa), and the holding forces applied by the anchoring members to the optical element remain constant, whether or not the optical element is mounted in an optical column. Hence, the optical element does not experience significant distortion by stress (or changes in stress) that otherwise would be imparted to the element from the holding device. Here, "significant" means a level of stress that would cause the optical performance of the optical element to exceed specifications. Also, if the holding frame is releasably attached to the optical column (e.g., using screws or analogous fasteners) the optical element can be removed, while remaining mounted to the holding device, for an out-of-column procedure to be performed on the optical element. During execution of the out-of-column procedure, the optical element remains securely mounted so as not to become displaced relative to the holding device. Also, since the optical element remains mounted to the holding device by clamping forces that remains substantially constant, the optical element experiences no significant change in stress while being subjected to the out-of-column procedure.

The foregoing and additional features and advantages of the invention will be more readily apparent from the following detailed description, which proceeds with reference to the accompanying drawings.

DETAILED DESCRIPTION

Various aspects of the invention are described below in the context of representative embodiments, which are not intended to be limiting in any way.

Figures 1, 2A, 2B:
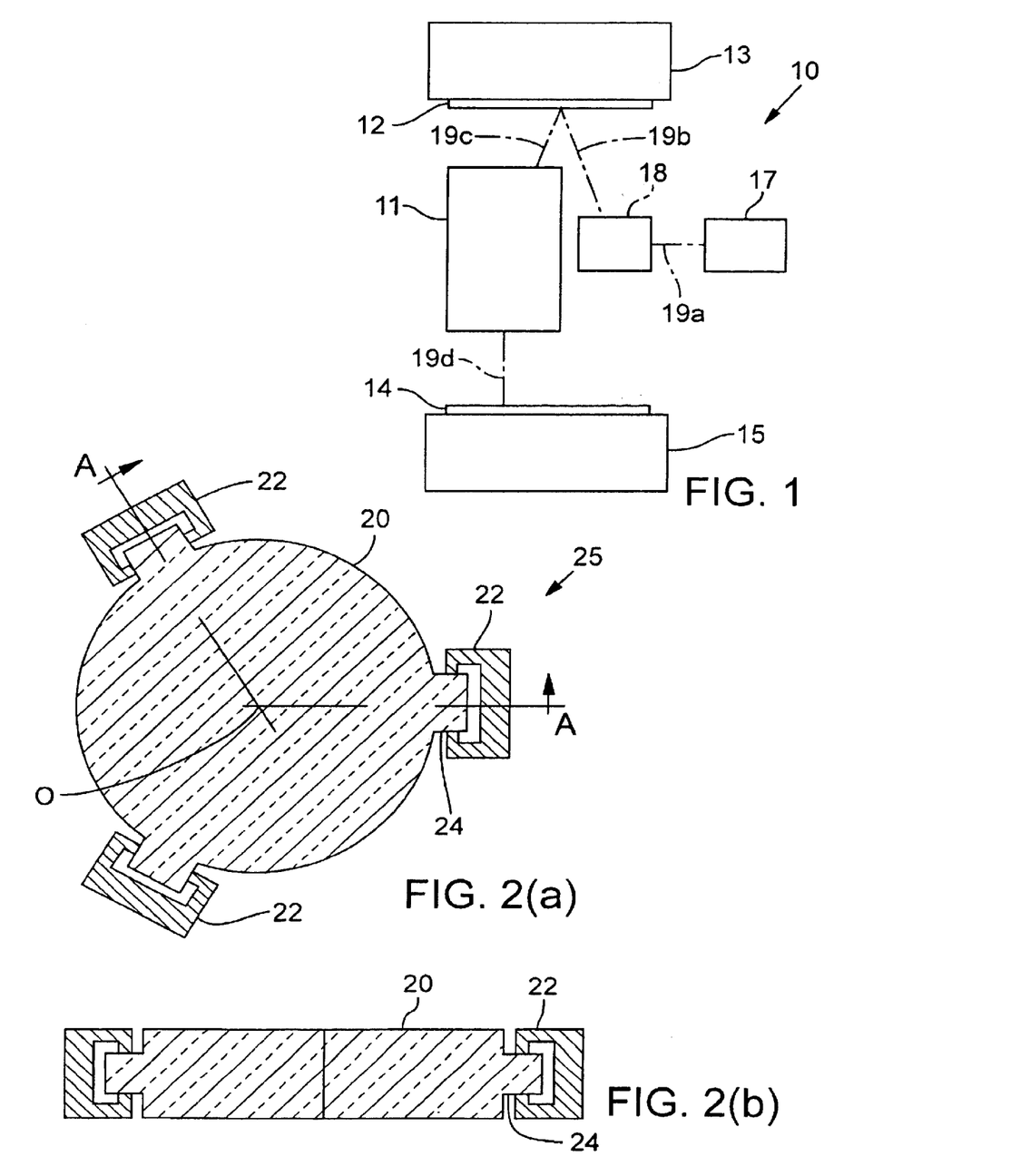
FIG. 1 is a schematic elevational diagram of an EUV lithography (EUVL) system in which at least one optical element thereof is held in its optical column using an embodiment of an optical-element-holding device as described below.
FIGS. 2(a)–2(b) are a plan view and elevational section (along the line A-O-A of FIG. 2(a)), respectively, of an optical-element-holding device according to a first representative embodiment.

An embodiment of an EUV microlithography system 10, in which optical elements are held using respective devices and methods as described later below, is shown in FIG. 1. The subject system 10 comprises an EUV source 17 that produces a beam 19a of EUV radiation. The system also comprises an illumination-optical system 18 that is situated and configured to receive the beam 19a, to form the beam 19a into an "illumination beam" 19b, and to direct the illumination beam 19b onto a selected region of a reticle 12 mounted to a reticle stage 13. As the illumination beam 19b illuminates the selected region, EUV light reflected (as a "patterned beam" 19c) from the selected region carries an aerial image of the illuminated region. The projection-optical system 11 forms the patterned beam 19c into a focused beam 19d that projects a focused image, corresponding to the aerial image, on the surface of a lithographic substrate 14 (e.g., resist-coated semiconductor wafer). During exposure the substrate 14 is mounted on a substrate stage 15.

In this system 10 the exposure wavelength is 13.4 nm, which requires that the reticle 12 be a reflective reticle. The projection-optical system 11 typically is a "reducing" (demagnifying) system, which means that the image formed thereby on the substrate 14 is smaller (by a factor termed the "demagnification factor") than the corresponding pattern on the reticle 12. By way of example, the projection-optical system 11 comprises six multilayer-coated mirrors, and has a demagnification factor of 1/5 and an exposure field that is 2-mm wide and 30-mm long. The six multilayer-coated mirrors are mounted, and supported relative to each other, inside a mirror "column." The mirror column typically is made of Invar or analogous material so as to be highly resistant to thermal expansion.

Each of the multilayer-coated mirrors in the projection-optical system 11 has an aspherical reflective surface formed by finely machining and polishing a respective mirror substrate. Each reflective surface also includes a surficial multilayer coating, such as a Mo/Si multilayer coating, to confer high reflectivity to incident EUV radiation. In this embodiment each multilayer-coated mirror is held in the mirror column by an optical-element holding device as described later below.

During exposure the reticle 12 and substrate 14 are moved in a scanning manner by their respective stages 13, 15. The scanning velocity of the substrate 14 is synchronized with the scanning velocity of the reticle 12 such that, for example, the substrate moves at 1/5 the scanning velocity of the reticle. This velocity ratio corresponds to a demagnification ratio of 1/5.

A representative embodiment of an optical-element-holding device 25 is shown in FIGS. 2(a)–2(b), wherein FIG. 2(a) is a plan view, and FIG. 2(b) is a cross section along the line A-O-A in FIG. 2(a). The optical element 20 being held by the subject holding device 25 has, by way of example, a round plan profile (FIG. 2(a)). The holding device 25 comprises multiple (three are shown) identical "anchoring members" 22 placed at respective locations around the perimeter of the optical element 20. Each anchoring member 22 can be made from a material such as metal or ceramic.

In this embodiment, the optical element 20 defines respective mounting ears 24 or analogous protrusions extending outward from the side surface of the optical element. The mounting ears 24 are dimensioned and situated so as to be inserted into respective anchoring members 22. This insertion of the mounting ears 24 into respective anchoring members 22 serves to hold the optical element 20.

To avoid contaminating the surface of the optical element 20, the anchoring members 22 desirably are made of a material that does not outgas significantly in a high-vacuum environment. Exemplary materials in this regard include, but are not limited to, metals such as Invar, Super-Invar, ceramic, and silicon.

The holding device 25 is effective not only for holding the optical element 20 in an optical column, but also for holding the optical element outside the optical column while the optical element is undergoing an "out-of-column" procedure such as polishing (e.g., for local correction of form error) or formation of a multilayer coating. An "out-of-column" procedure is a procedure (e.g., coating or polishing) performed on the optical element after removing the optical element from the column.

Each anchoring member 22 in this embodiment desirably has a certain degree of compliance or springiness. Compliance or springiness enables the anchoring member 22, while holding onto the respective mounting ear 24, to absorb stress originating in the optical element or that otherwise would be transmitted from the holding device (or column) to the optical element, and to accommodate variations in the planarity and parallelism of the mounting ears 24, if used.

Figure 6:
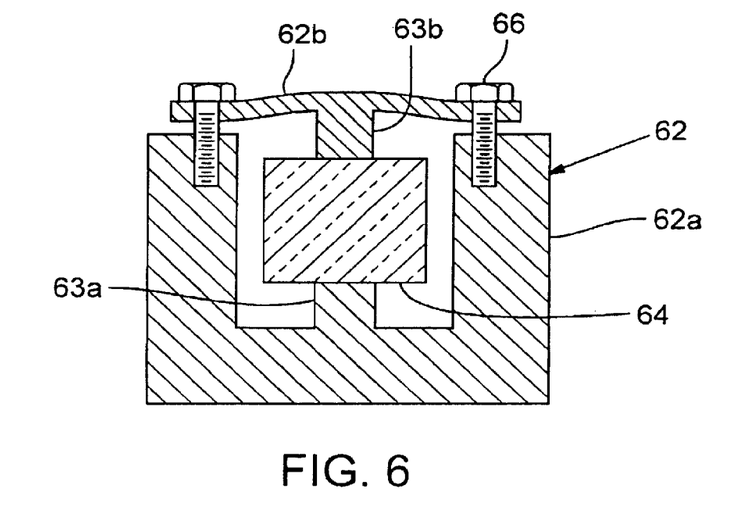
FIG. 6 is an elevational section showing details of an anchoring member according to yet another exemplary embodiment. Also shown is a mounting ear of the optical element configured to be held by the anchoring member.

Another embodiment of the anchoring members is shown in FIG. 6, in which each anchoring member 62 comprises first and second portions, of which portions one is compliant and the other need not be compliant. More specifically, in this embodiment, each anchoring member 62 includes a first portion 62a, which typically is rigid, and a second portion 62b, which has a springy or otherwise compliant characteristic. (E.g., the second portion 62b can be made of an elastic or flexible material. Alternatively, both portions 62a, 62b can be compliant.) Each portion 62a, 62b has a respective protrusion 63a, 63b. The protrusions extend toward each other, and hence extend toward and contact a mounting ear 64 of the optical element during use. The compliance of the second portion 62b typically is limited as required for absorbing stress and controlling deformation of the anchoring member 62 as a whole and/or of the optical element being held thereby. The second portion 62b is attached to the first portion 62a by any of various suitable fasteners such as screws 66. As shown in FIG. 6, whenever a mounting ear 64 is held between the first and second portions 62a, 62b of a respective anchoring member 62, the compliance of the second portion 62b is provided by the second portion 62b being spring-loaded relative to the first portion 62a. This spring-loading allows the second portion 62b to absorb deformations or positional shifts of the respective mounting ear 64, which avoids stress accumulation in the optical element resulting from such deformations or shifts in position.

The portions 62a, 62b of the anchoring member 62 simply can contact (via their respective protrusions 63a, 63b) the mounting ear 64 as shown in FIG. 6 or can be adhered to the mounting ear 64 by, for example, anodic welding. So as to be anodically weldable, the portions 62a, 62b can be made of a material such as silicon. In this example, after contacting the protrusions 63a, 63b to the mounting ear 64 (made of, e.g., glass, quartz, or other glassy material), the points of contact are heated to a sufficiently high temperature and subject to an applied voltage to form glass-silicon welds.

In the embodiment of FIG. 6 and in other embodiments, if the respective coefficients of thermal expansion of the optical element and the anchoring members are different from each other, then the resulting differences in response to thermal changes can cause the anchoring members to deform relative to the optical element, or vice versa. To prevent this kind of deformation, the difference in the respective thermal-expansion coefficients of the optical element relative to the anchoring members desirably is as small as possible. It is desirable that this difference be $1 \times 10^{-6} K^{-}$ or less for optical elements in a projection-optical system as used in an EUVL system. For example, if the optical element is formed of low-expansion glass (having a thermal-expansion coefficient of, e.g., $3 \times 10^{-8} K^{-1}$), then the anchoring members can be made of Invar (having a thermal-expansion coefficient of $1 \times 10^{-8} K^{-1}$). These materials also exhibit good dimensional stability to changes in temperature.

Returning to FIGS. 2(a)–2(b), the mounting ears 24 (if used) can be formed by a suitable process such as grinding or the like conducted at the perimeter of the optical element 20, or formed integrally with the optical element 20. In FIG. 2(a) the mounting ears 24 are provided at three locations, situated equi-angularly (120°) relative to each other, around the periphery of the optical element 20. It is possible to provide more than three mounting ears 24 (each intended to interact with a respective anchoring member 22). In addition, it is not necessary that the mounting ears 24 be situated equi-angularly relative to each other. (Equi-angular disposition is desirable for maximal effectiveness in preventing displacement of the optical element 20 relative to the holding device 25.) Furthermore, the optical element 20 need not include mounting ears 24 for mounting the anchoring members 22 to the optical element 20. In other words, the mounting ears can be provided for convenience, but they in many instances are not necessary. This is because certain configurations of anchoring members can be attached to the optical element without having to use mounting ears. Also, in certain instances, anchoring members can be attached to the optical element (e.g., at selected locations around the periphery of an earless optical element) without interfering with proper functioning of the optical element.

Figure 3:
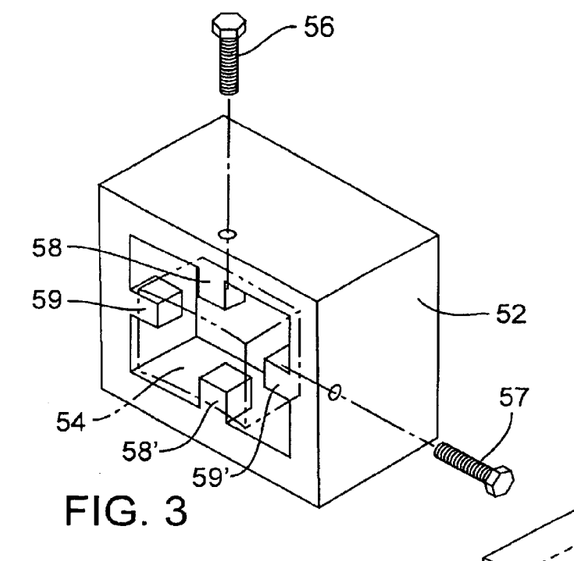
FIG. 3 is an oblique view showing details of an anchoring member according to a first exemplary embodiment.

Another exemplary embodiment of the anchoring member is shown in FIG. 3, in which the depicted anchoring member 52 defines two pairs of opposing, inwardly facing protrusions 58, 58' and 59, 59' that extend toward a mounting ear 54 whenever the mounting ear 54 is inserted into the anchoring member 52. After inserting the mounting ear 54, securing the mounting ear to the protrusions 58, 58' and 59, 59' is achieved by tightening respective screws 56, 57. To provide the desired compliance, the entire anchoring member 52 of this embodiment can be made of a compliant material, or the screws 56, 57 can be made of a compliant material while the anchoring member 52 is made of a rigid, non-compliant material (or both anchoring member 52 and screws 56, 57 can be compliant). In this embodiment, each mounting ear 54 is clamped from two directions, which can be desirable under certain conditions. Specifically, in this example the mounting ear 54 is clamped in a direction parallel to the optical axis of the optical element by the screw 56 and protrusions 58, 58' and in a direction tangential to the circumference of the optical element by the screw 57 and protrusions 59, 59'. By clamping in two directions in this manner, the optical element can be held more securely than it otherwise would be if it were clamped in only one direction in each anchoring member (see embodiments of FIGS. 2(a) and 6, discussed above, which involve clamping in one direction).

Figure 4:
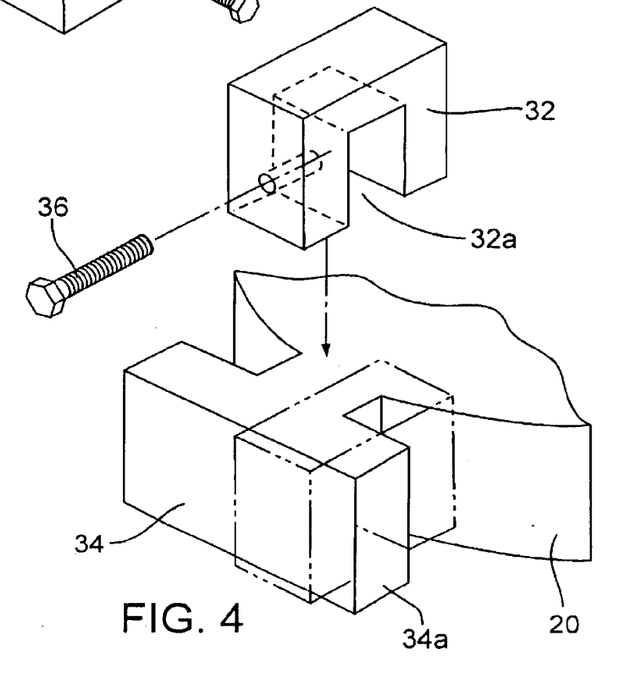
FIG. 4 is an oblique view showing details of an anchoring member according to a second exemplary embodiment. Also shown is a mounting ear of the optical element configured to be held by the anchoring member.

In yet another exemplary embodiment, as shown in FIG. 4, the optical element 20 is anchored in a slightly different manner than in the embodiments discussed above. In FIG. 4, the optical element has a mounting ear 34 that includes two lobes 34a. On each mounting ear 34, a respective lobe 34a is inserted into a complementary notch 32a of a respective anchoring member 32. Clamping of the lobe 34a is achieved by tightening a respective screw 36 on the anchoring member 32. Thus, clamping is in a substantially radial direction (of the optical element 20) in FIG. 4, in contrast to the clamping directions in the embodiments of, e.g., FIGS. 3 and 6. The radial clamping direction shown in FIG. 4 is perpendicular to the optical axis and to lines tangential to the circumference of the optical element 20. The manner of clamping shown in FIG. 4 effectively prevents radial displacement of the optical element 20 relative to the holding device. In this embodiment the anchoring members 32 can be made of a compliant material, or the screws 36 can be compliant while the anchoring members are made of a rigid material, or both the anchoring members 32 and screws 36 can be compliant.

Figure 5:
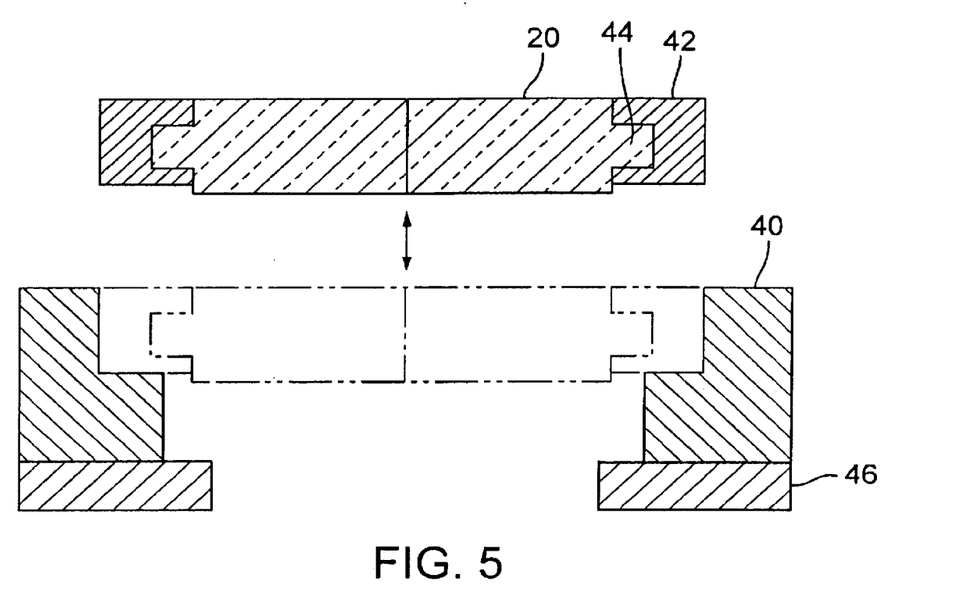
FIG. 5 is an elevational section showing attachment of an optical element (with attached anchoring members) to a holding frame mounted to an optical column, according to a representative embodiment.

Turning now to FIG. 5, the optical element 20 includes an edge-surface extension 44 that, at several locations around the periphery of the optical element 20, is inserted into respective anchoring members 42. The anchoring members 42 (with attached optical element 20) can be mounted to and held by a holding frame 40 that can be (or already has been) mounted to a suitable mounting plate 46 in an optical column or other system. Alternatively, in some embodiments, the optical element can be mounted to the anchoring members after the anchoring members have been mounted to the holding frame 40. Mounting of the anchoring members to the holding frame 40 desirably is by a releasable attachment mechanism that encompasses any of various mechanisms and fasteners by which the anchoring members 42 are attached to (in a releasable manner) the holding frame 40. For example, the respective releasable attachment mechanism can comprise screws, bolts, or the like, or other fasteners.

A key aspect of the various embodiments discussed above is the detachability of the anchoring members from the holding frame (see FIG. 5). During construction of an EUV microlithography system, various mirror-related tasks are required, such as mirror-shape measurements, mirror-polishing, wave-front measurements, etc. Each of these tasks typically requires that the mirror be held by a different holding frame. Preferably, the mechanical stress imparted to the mirror by the various holding frames is substantially zero. Achieving this substantially zero mounting stress is facilitated by use of the anchoring members. If the anchoring members being attached to the mirror (or other optical element) deform the mirror, the resulting error in the mirror surface can be removed by polishing. Importantly, the mechanical stress of the mirror (or other optical element) remains substantially unchanged from one holding frame to another. In contrast, if the mirror (or other optical element) were held directly by the various holding frames (as is done conventionally), then the mechanical stress imparted to the mirror (or other optical element) would be different in each holding frame and also at different times in the same holding frame. The resulting adverse effects on the mirror surface cannot be removed by polishing. This is because polishing to remove the error under one circumstance may not cure the error (or may even exacerbate the error) under another circumstance.

Releasable attachment of the anchoring members to the holding frame can be accomplished by providing each anchoring member with a releasable attachment mechanism, or by providing the holding frame with a respective releasable attachment mechanism for each anchoring member, or both.

Although, in the embodiments described above, the mounting ears of the particular optical elements shown extended radially outward from the circumference of the optical elements, this is not intended to be limiting. It will be understood that optical elements can have any of various configurations other than circular, and that mounting ears (if present) need not extend radially from the optical element. It also will be understood that mounting ears alternatively or additionally can extend, for example, from a rear surface of the optical element. Also, mounting ears need not be an integral part of the optical element in the manner shown in the figures corresponding to the embodiments discussed above. Mounting ears (if used) alternatively can be formed separately from the optical element and attached to the optical element, e.g., using an adhesive or by welding, or eliminated entirely. In any event, in a holding device the anchoring members are placed (or are positionable) and configured in a particular manner so as to receive and hold the particular optical element to be held by the device.

Also, it will be understood that the "holding frame" 40 can have any of various configurations suitable for mounting the anchoring members thereto and for holding the anchoring members at the requisite positions relative to each other. The holding frame 40 can be circular or not circular as conditions indicate.

Using an optical-element holding device as described above, an optical element mounted in an optical column of an EUVL system can be attached and removed easily from the optical column while the optical element remains attached to the holding device. Ease of attachment and detachment of the anchoring members from the holding frame in the optical column facilitates replacement of an optical element if the optical element has deteriorated or exhibits defective performance. After removing an optical element in this manner from the optical column, the optical element may be replaced with a new element or subjected (again, while remaining attached to the holding device) to an "out-of-column" corrective procedure such as polishing or recoating to restore performance, and then re-installed in the column.

A representative "out-of-column" procedure is polishing, which is performed on the optical element after removal (while remaining attached at least to the anchoring members 42) from the optical column. (Alternatively, the optical element can be removed (while keeping the anchoring members attached thereto) while remaining attached to the holding frame. The anchoring members (while remaining attached to the optical element) can be mounted in another holding frame for polishing. The mounting device used for polishing can be any of the embodiments described above.) Desirably, the anchoring members (and holding frame, if used) of the holding device are made of material(s) that are not dissolved or otherwise affected by any materials (such as polishing slurry or cleaning liquids) used during polishing. In either event, the optical element is held as described above and positioned for localized polishing of the offending portion of the reflective surface of the optical element. As the optical element is being held in this manner, the stress being applied to the optical element does not change or cause a change in deformation of the optical element. This allows polishing to be performed without causing unwanted deformation of the optical element before or after fabricating the optical element.

Another exemplary "out-of-column" procedure that can be performed on the optical element is a coating procedure, in which coating is performed while the element is being held (via the anchoring members) in a holding frame of the coating machine such as a sputtering apparatus. During coating the optical element is anchored to the holding frame using anchoring members (made of a material such as metal, ceramic, or other material unaffected by coating conditions and that does not outgas significantly in a vacuum environment), as described above. A multilayer coating (or other suitable coating) is applied to the optical element as the element is being held in this manner. Meanwhile, the stress being applied to the optical element does not change. This allows coating to be performed without imparting any stress-related changes to the optical element before or after fabricating the optical element.

While subjecting the optical element to an out-of-column procedure, the profile of the reflective surface of the optical element typically is measured before and after performing the procedure. Since the optical element is held by the anchoring members in the same manner as the element was or will be held in the optical column, these profile measurements can be made under actual-use conditions, which improves the accuracy and effectiveness of the procedure. For example, any deformation experienced by the optical element is the same during the procedure as during the time the element is mounted in the column.

Since the optical element is mounted to anchoring members that can be mounted, separately from the optical element, in a holding frame by means of releasable attachment mechanism or the like, the holding frame itself does not impart stress to the optical element. Thus, the holding frame does not impart any significant change in holding force to the optical element.

Whereas the invention has been described in connection with representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. With respect to an optical element that, during use, is mounted in an optical column, a method for holding the optical element, comprising:
   attaching a respective anchoring member to each of multiple attachment locations on the optical element so as to hold each anchoring member at a respective position relative to the optical element, each anchoring member having at least one respective compliant portion configured to prevent, while the anchoring member is attached to the optical element, significant transmission of stress to and from the optical element through the anchoring member;
   for use of the optical element, keeping the anchoring members attached to the optical element and mounting the optical element via the anchoring members in the optical column; and
   for subjecting the optical element to an out-of-column procedure, keeping the anchoring members attached to the optical element in the same manner as when the optical element was or will be held in the optical column, and attaching the anchoring members to a holding frame so as to hold the optical element in a position suitable for performing the procedure.

2. The method of claim 1, further comprising the steps of:
   while holding the optical element in the holding frame, performing the out-of-column procedure on the optical element;
   after completing the out-of-column procedure and while keeping the anchoring members attached to their respective locations on the optical element, releasing the anchoring members from the holding frame; and
   mounting the optical element, via the anchoring members, in the optical column.

3. With respect to an optical element that, during use, is mounted in an optical column, a method for holding the optical element in the optical column and for holding the optical element outside the column while the optical element is being subjected to an out-of-column procedure, the method comprising:
   attaching a respective anchoring member to each of multiple attachment locations on the optical element so as to hold each anchoring member at a respective position relative to the optical element, each anchoring member having at least one respective compliant portion configured to prevent, while the anchoring member is attached to the optical element, significant transmission of stress to and from the optical element through the anchoring member;
   for use of the optical element, mounting the optical element via the anchoring members to the optical column; and
   for subjecting the optical element to the out-of-column procedure, keeping the anchoring members attached to the optical element in the same manner as when the optical element was or will be held in the optical column, and attaching the anchoring members to a holding frame so as to hold the optical element in a position suitable for performing the procedure.

4. The method of claim 3, further comprising the step, before subjecting the optical element to the out-of-column procedure and while keeping the anchoring members attached to the optical element, of removing the optical element from the column.

5. The method of claim 3, wherein the out-of-column procedure is a polishing procedure in which a surface of the optical element is polished.

6. The method of claim 5, further comprising the steps:
   while holding the optical element in the holding frame, polishing the optical element;
   after completing polishing and while keeping the anchoring members attached to the optical element, releasing the anchoring members from the holding frame; and
   mounting the optical element, via the anchoring members, in the optical column.

7. The method of claim 3, wherein the out-of-column procedure is a coating procedure in which a surface of the optical element is coated.

8. The method of claim 7, further comprising the steps:
   while holding the optical element in the holding frame, coating the surface of the optical element;
   after completing coating and while keeping the anchoring members attached to the optical element, releasing the anchoring members from the holding frame; and
   mounting the optical element, via the anchoring members, in the optical column.

9. With respect to an optical element that, during use, is mounted in an optical column, a method for holding the optical element in the optical column and for holding the optical element outside the optical column as the optical element is being subjected to an out-of-column procedure, the method comprising:
   attaching a respective anchoring member to each of multiple attachment locations on the optical element so as to hold each anchoring member at a respective fixed position relative to the optical element, each anchoring member having at least one respective compliant portion configured to prevent, while the anchoring member is attached to the optical element, significant transmission of stress to and from the optical element through the anchoring member;

for use of the optical element, keeping the anchoring members attached to the optical element and releasably mounting the optical element via the anchoring members in the optical column; and for subjecting the optical element to the out-of-column procedure, keeping the anchoring members attached to the optical element in the same manner as when the optical element was or will be held in the optical column, and releasably attaching the anchoring members to a holding frame so as to hold the optical element in a process position in which the out-of-column procedure is performed on the optical element.

10. The method of claim 9, wherein:

the out-of-column procedure is a polishing procedure; and the process position is a polishing position.

11. The method of claim 9, wherein:

the out-of-column procedure is a coating procedure; and the process position is a coating position.

12. With respect to an optical element that, during use, is mounted in an optical column, a method for holding the optical element while subjecting the optical element to an out-of-column procedure, the method comprising:

attaching a respective anchoring member to each of multiple attachment locations on the optical element so as to hold each anchoring member at a respective position relative to the optical element, each anchoring member having at least one compliant portion configured to prevent, while the anchoring member is attached to the optical element, significant transmission of stress to and from the optical element through the anchoring member;

whenever using the optical element, mounting the optical element in the optical column via the anchoring members; and whenever subjecting the optical element to the out-of-column procedure, while keeping the anchoring members attached to the optical element in the same manner as when the optical element was or will be held in the optical column, mounting the anchoring members to a holding frame so as to hold the optical element in a process position.

13. The method of claim 12, further comprising the step, before mounting the anchoring members to the holding frame and while keeping the anchoring members attached to the optical element, of removing the optical element from the column.

14. The method of claim 12, further comprising the step, while the optical element is being held by the holding frame, of subjecting the optical element to the out-of-column procedure.

15. The method of claim 14, further comprising the steps, after completing the out-of-column procedure:

while keeping the anchoring members attached to the optical element, detaching the optical element from the holding frame; and while keeping the anchoring members attached to the optical element, mounting the optical element in the optical column.

16. A method for performing an out-of-column procedure on a surface of an optical element that, during use, is mounted in an optical column, the method comprising:

attaching a respective anchoring member to each of multiple attachment locations on the optical element, each anchoring member having at least one respective compliant portion configured to prevent, while the anchoring member is attached to the optical element, significant transmission of stress to and from the optical element through the anchoring member, the optical element being mountable via the anchoring members to the optical column for use of the optical element;

for performing the out-of-column procedure, releasably attaching the anchoring members to a holding frame configured to hold each anchoring member at a respective position relative to the optical element and thereby hold the optical element in a process position in which the out-of-column procedure is performed on the optical element; and performing the out-of-column procedure.

17. The method of claim 16, wherein the out-of-column procedure is a coating procedure.

18. The method of claim 16, wherein:

the optical element is a mirror; and the out-of-column procedure is a procedure by which a multilayer-film reflective coating is applied to the surface of the mirror.

19. The method of claim 16, wherein the out-of-column procedure is a polishing procedure.

20. The method of claim 19, wherein:

the optical element is a mirror; and the out-of-column procedure is a procedure by which the surface of the mirror is polished.

\* \* \* \* \*

UNITED STATES PATENT AND TRADEMARK OFFICE
CERTIFICATE OF CORRECTION

PATENT NO. : 6,878,042 B2
DATED : April 12, 2005
INVENTOR(S) : Oshino

It is certified that error appears in the above-identified patent and that said Letters Patent is hereby corrected as shown below:

Column 3, line 67 - Column 4, line 2,
"Yamamoto, *7 th International Conference on Synchrotron Radiation Instrumentation*, Berlin, Germany, Aug. 21-25, 2000, POS2-189)." should be -- Yamamoto, *7th International Conference on Synchrotron Radiation Instrumentation*, Berlin, Germany, Aug. 21-25, 2000, POS2-189. --.

Column 6,
Line 14, "car," should be -- ear, --.
Line 46, "positions" should be -- position --.
Lines 54-55, "a respective anchoring members" should be -- respective anchoring members --.

Column 10,
Line 2, "$1 \times 10^{-6} K$" should be -- $1 \times 10^{-6} K^{-1}$ --.

Signed and Sealed this

Sixth Day of December, 2005

JON W. DUDAS
*Director of the United States Patent and Trademark Office*